United States Patent [19]
Fromm

[11] Patent Number: 5,941,171
[45] Date of Patent: Aug. 24, 1999

[54] STENCIL HOLDER

[75] Inventor: Alfred Fromm, Reutlingen, Germany

[73] Assignee: Bebro-Electronic Bengel & Bross GmbH, Frickenhausen, Germany

[21] Appl. No.: 08/850,962

[22] Filed: May 5, 1997

Related U.S. Application Data

[63] Continuation of application No. PCT/EP95/04319, Nov. 3, 1995.

[30] Foreign Application Priority Data

| Nov. 5, 1994 | [DE] | Germany | 44 39 608 |
| Mar. 28, 1995 | [DE] | Germany | 195 11 330 |
| Aug. 18, 1995 | [DE] | Germany | 195 30 373 |
| Oct. 17, 1995 | [DE] | Germany | 295 16 465 U |

[51] Int. Cl.$^6$ .................................................. B05C 17/00
[52] U.S. Cl. ........................................ 101/127.1; 101/127
[58] Field of Search .................................. 101/114, 127, 101/127.1, 128.1; 38/102–102.91

[56] References Cited

U.S. PATENT DOCUMENTS

| 2,565,218 | 8/1951 | Freeborn . | |
| 3,078,793 | 2/1963 | Jaffa et al. . | |
| 3,255,540 | 6/1966 | Gilman . | |
| 3,391,635 | 7/1968 | Matheus . | |
| 3,414,994 | 12/1968 | Jaccard et al. . | |
| 3,416,445 | 12/1968 | Krueger | 101/128.1 |
| 3,469,695 | 9/1969 | Greeninger . | |
| 3,788,216 | 1/1974 | Lambert . | |
| 3,908,293 | 9/1975 | Newman . | |
| 4,041,861 | 8/1977 | Alter . | |
| 4,442,772 | 4/1984 | Bubley . | |
| 5,063,842 | 11/1991 | Clarke | 101/128.1 |
| 5,347,925 | 9/1994 | Holderegger | 101/127.1 |
| 5,606,911 | 3/1997 | Cane | 101/127.1 |

FOREIGN PATENT DOCUMENTS

| 953973 | 9/1974 | Canada . | |
| 0 120 651 | 10/1984 | European Pat. Off. . | |
| 32 27 434 | 1/1984 | Germany . | |
| 60-79953 | 5/1985 | Japan . | |
| 1220812 | 3/1986 | U.S.S.R. | 101/127.1 |

*Primary Examiner*—Ren Yan
*Attorney, Agent, or Firm*—Barry R. Lipsitz; Ralph F. Hoppin

[57] ABSTRACT

In order to improve a stencil holder for stencils made of metal films, preferably for screen printing, comprising a frame, at least two stencil receiving means arranged on the frame and detachably holding the stencil and a stencil tensioning device, with which the stencil can be tensioned in at least a first tensioning direction, such that the stencil can be tensioned as evenly as possible, it is suggested that the stencil have holding strips extending on from a stencil section, that these holding strips extend at the most over the respective length of an edge of the stencil section in the respective longitudinal direction thereof, that each holding strip be detachably securable on a respective stencil receiving means and that the stencil be tensionable in a first tensioning direction and a second tensioning direction extending transversely to the first by means of the stencil tensioning device acting on the stencil receiving means.

30 Claims, 12 Drawing Sheets

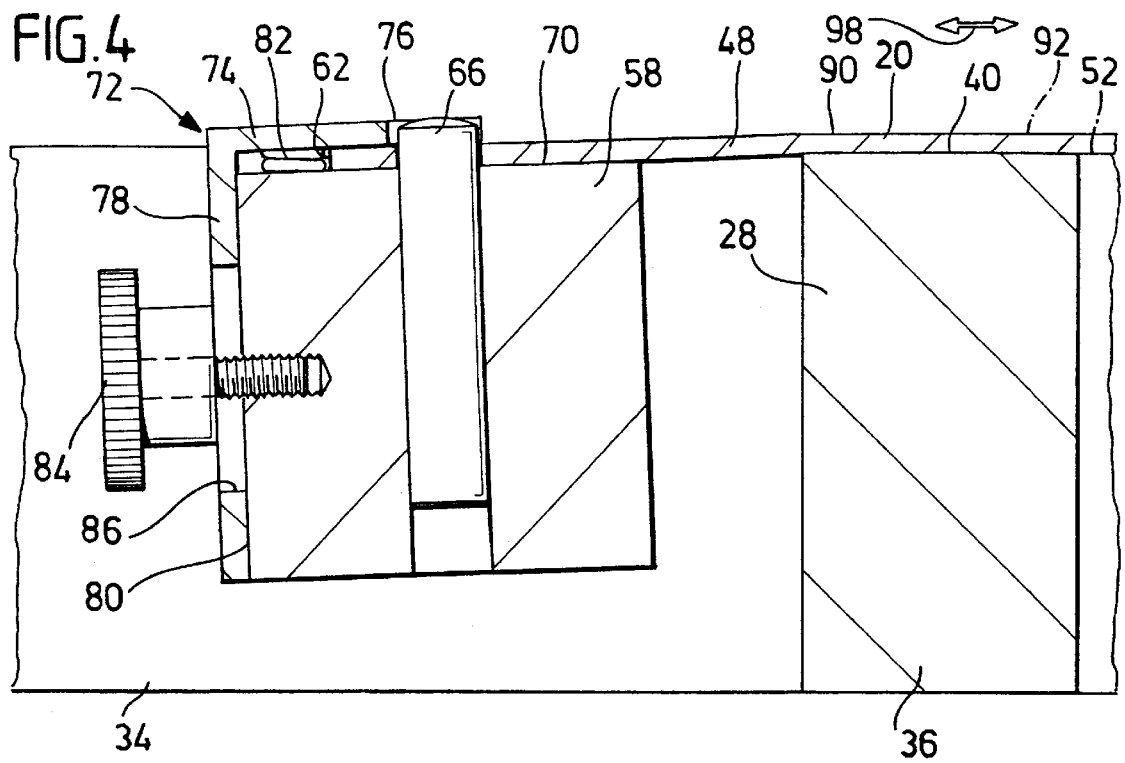
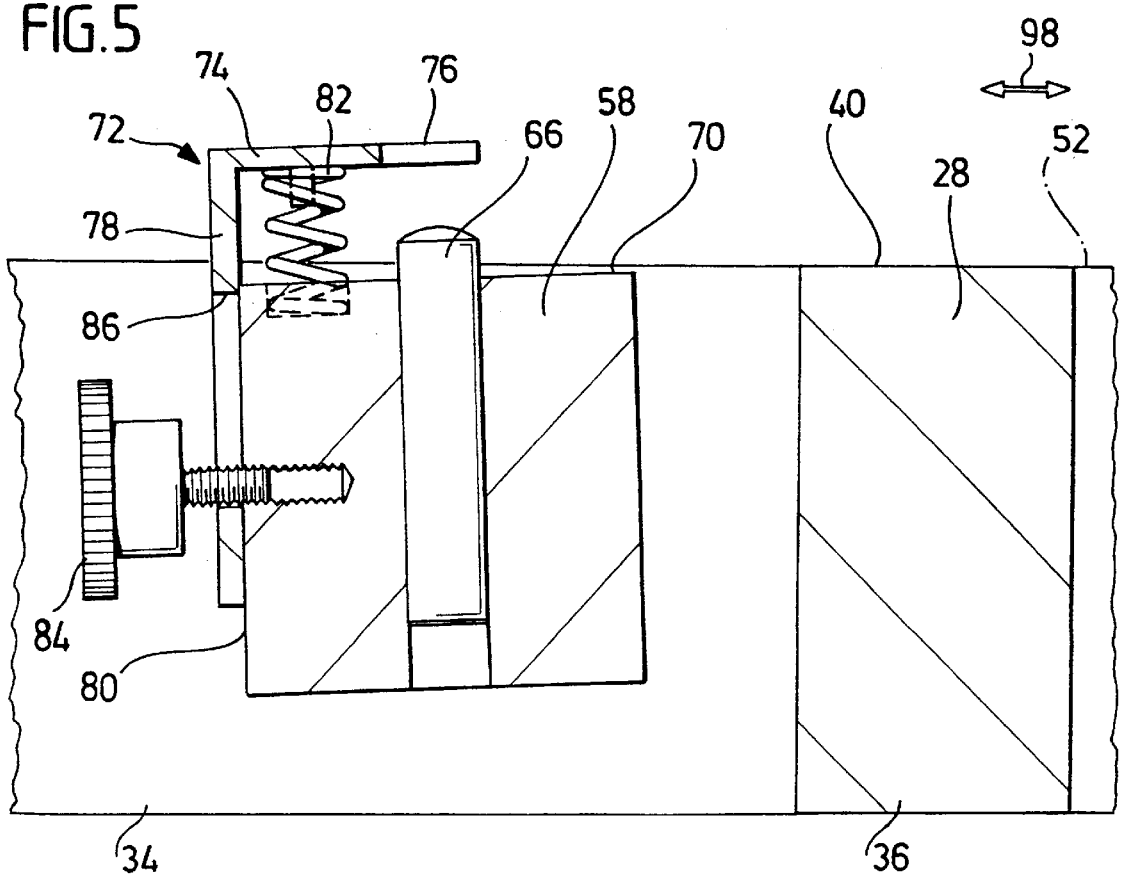

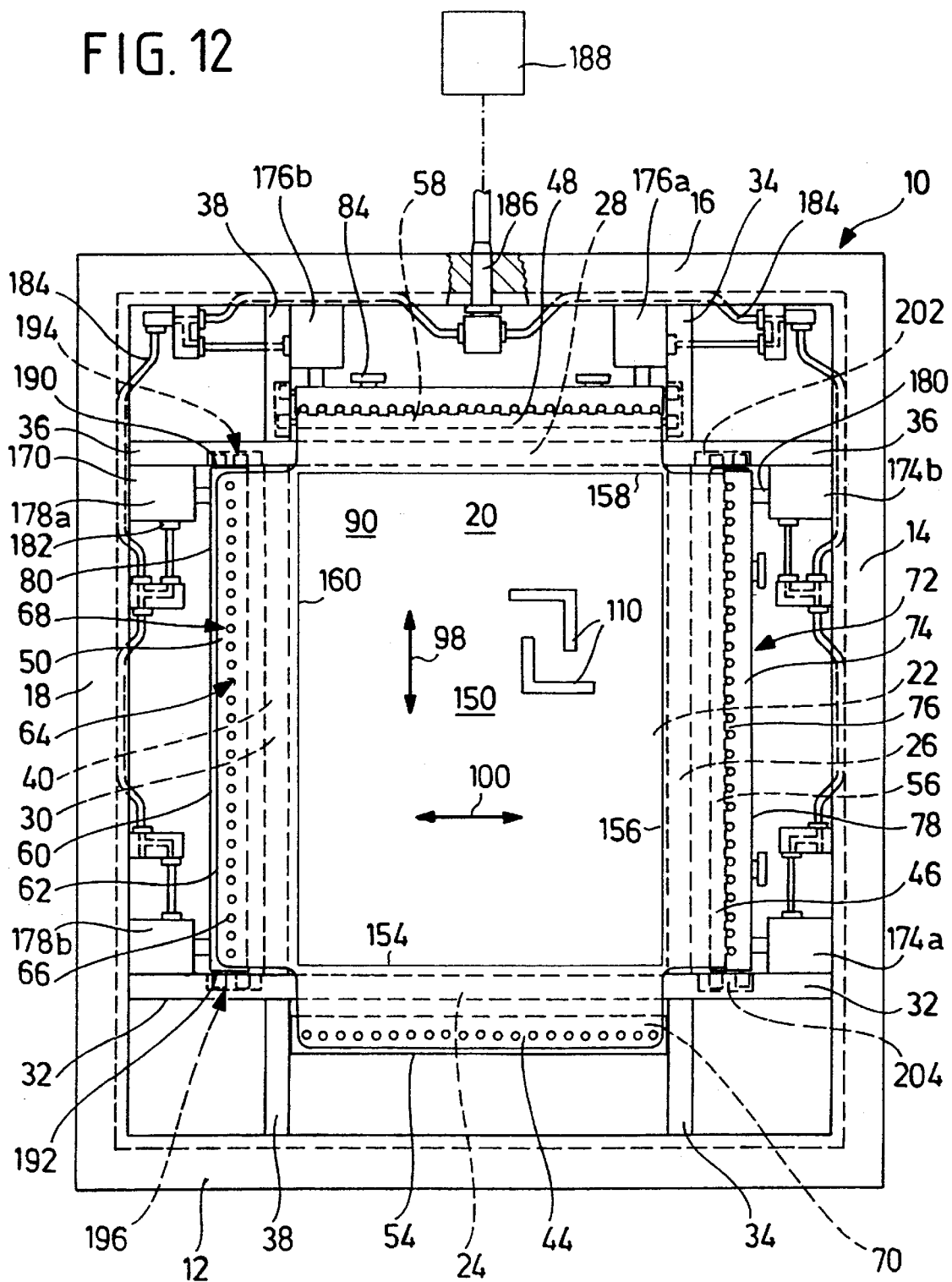

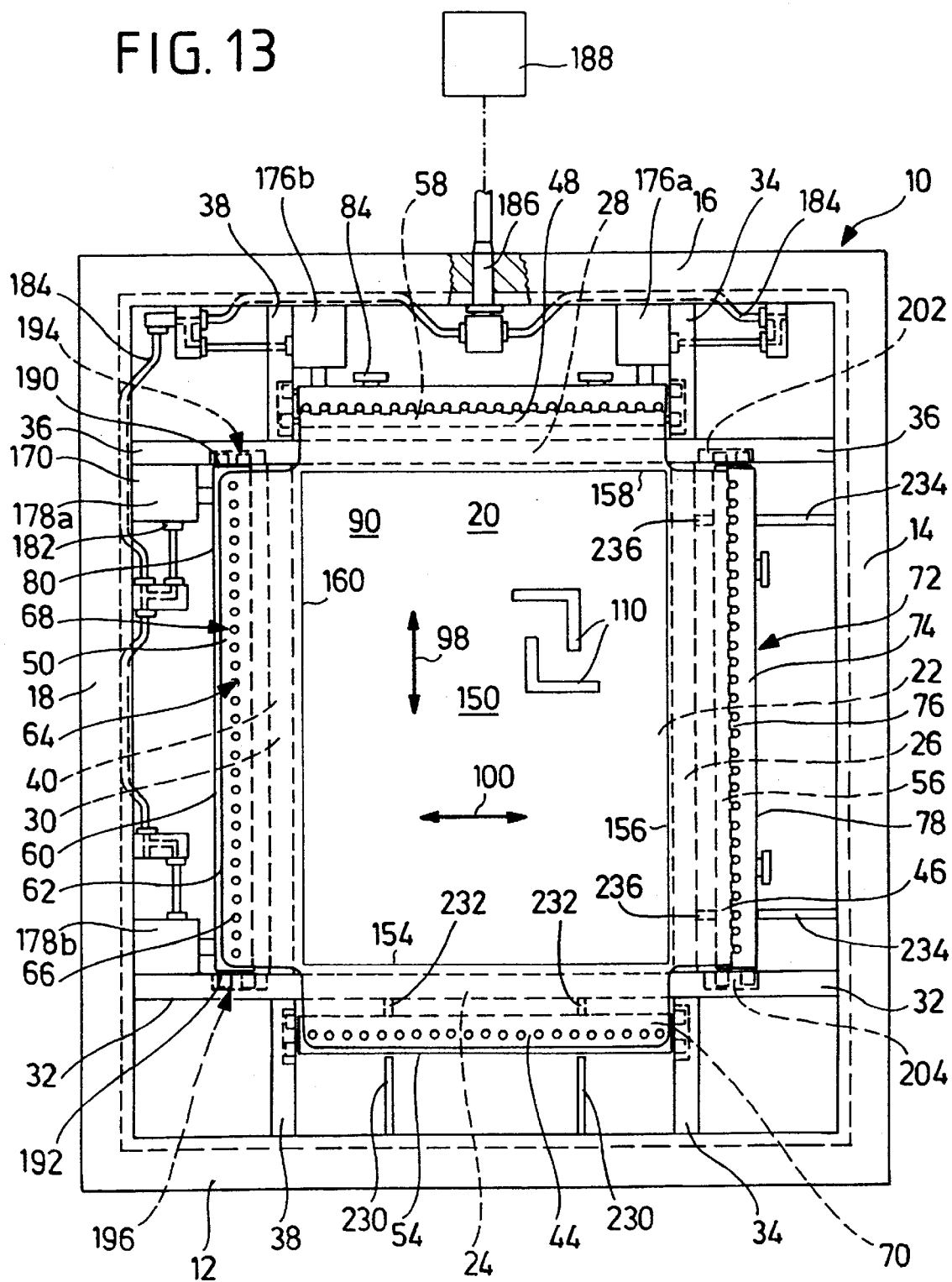

STENCIL HOLDER

This application is a continuation of International PCT Application No. PCT/EP95/04319 filed on Nov. 3, 1995.

BACKGROUND OF THE INVENTION

The invention relates to a stencil holder for stencils made of metal films, preferably for screen printing, in particular for the application of adhesive for adhering electronic components to printed circuit boards or solder paste for the reflow soldering of electronic components to printed circuit boards, comprising a frame, at least two stencil receiving means arranged on the frame and detachably holding the stencil and a stencil tensioning device, with which the stencil can be tensioned in at least a first tensioning direction.

Stencil holders of this type are known from the brochure "DEK MICROMOUNT—Fortgeschrittenes Schablonen-Spannsystem" of DEK Precision Screen Division, 11 Albany Road, Granby Industrial Estate, Weymouth, Dorset DT4 9TH, England. With these, the stencil is, for example, secured by the two oppositely located stencil receiving means and tensioned in the first tensioning direction extending between the stencil receiving means.

However, the stencil cannot be evenly tensioned in these known tensioning devices.

SUMMARY OF THE INVENTION

The object underlying the invention is therefore to improve a stencil holder of the generic type such that the stencil can be tensioned as evenly as possible.

This object is accomplished in accordance with the invention, in a stencil holder of the type described at the outset, in that the stencil has holding strips extending on from a stencil region, that these holding strips extend at the most over the respective length of an edge of the stencil region in the respective longitudinal direction thereof, that each holding strip can be detachably secured on a respective stencil receiving means and that the stencil can be tensioned in a first tensioning direction and a second tensioning direction extending transversely to the first by means of the stencil tensioning device acting on the stencil receiving means.

The advantage of the inventive solution is to be seen in the fact that with this solution the tensioning forces can have an optimum effect on the stencil region and are not altered, in particular, reduced by holding strips, which extend beyond the stencil region and are connected with one another in these regions extending beyond the stencil region, and thereby act unevenly on the stencil and lead in the extreme case to deformations.

In the inventive solution, an additional great advantage with respect to the even tensioning of the stencil is to be seen, in particular, in the fact that this can be tensioned in two tensioning directions extending transversely to one another and thus the stencil region, in particular, is tensioned in two tensioning directions extending at right angles to one another, in contrast to the solution known from the state of the art, in which tensioning takes place only in one tensioning direction.

In principle, it would be conceivable to manufacture the stencil region and the holding strips from different materials and, for example, to connect the holding strips with the stencil region in any suitable manner.

It is, however, far more advantageous when the stencil region and the holding strips are made from a one-piece metal film.

In the inventive solution, the stencil is expediently designed such that this has a rectangular stencil region and a total of four holding strips located opposite one another in respective pairs, each pair of holding strips being tensionable in one tensioning direction.

In principle, it would be possible to secure each holding strip on a plurality of stencil receiving means. It is, however, particularly advantageous when each holding strip, in particular as a whole, can be detachably secured on a single stencil receiving means so that each stencil receiving means as a whole applies the tensioning force to the entire holding strip.

In order to secure the holding strips detachably on the stencil securing means, it is preferably provided for each holding strip to be detachably secured on the respective stencil receiving means by positive connection. In contrast to a frictional connection, a positive connection provides a solution which is far simpler and more suitable for the absorption of a tensioning force that a frictional connection.

In the simplest case, it is provided for each holding strip to be detachably secured on the respective stencil receiving means by a row of form-locking elements, the form-locking elements preferably being arranged in the row to follow one another at essentially uniform distances.

With respect to the securing of the stencil in the respective stencil receiving means, no details have so far been given. A frictional clamping would, for example, be conceivable. It has, however, proven to be particularly expedient when the stencil is secured in the stencil receiving means by positive connection since the tensioning forces can be transferred to the stencil far better via a positive connection.

Such a positive connection can be brought about by all types of form-locking elements which are operative between the stencil receiving means and the holding web. Such form-locking elements comprise, in the simplest case, apertures in the holding strips and holding elements passing through the apertures.

In the case of interchangeable stencils it has proven to be particularly advantageous when the stencil receiving means has a positioning means operative transversely to the tensioning direction. It is possible with this positioning means to exactly position the stencil transversely to the tensioning direction and thereby bring about the exact positioning of a stencil transversely to the tensioning direction automatically when it is exchanged.

This is particularly expedient in an inventive tensioning device, in which the stencil can be tensioned in two tensioning directions extending at right angles to one another since with such a positioning means it is then possible to exactly determine the location of the stencil in the plane formed by the stencil automatically.

Such a positioning means can be designed in the most varied of ways. Such a positioning means could, for example, be formed by optical marks. The positioning of the stencil is, however, particularly simple and reliable with a positioning means when this comprises a fit.

The fit can thereby be designed in the most varied of ways; it can be formed by two spaced fitting surfaces, between which a section of the stencil can be placed.

It is, however, particularly expedient when the fit is formed by a row of holes, in which corresponding fitting fingers engage.

A particularly advantageous embodiment provides for the apertures and the holding elements penetrating these apertures to be designed at the same time as fits for the exact positioning of the stencil in the stencil receiving means.

With respect to the design of the stencil receiving means, no details have been given in conjunction with the preceding explanations concerning the individual embodiments. In one advantageous embodiment, for example, two oppositely located holding webs which are mounted on the frame form the stencil receiving means in each tensioning direction, wherein one holding strip can be secured on each respective holding web.

Each holding web is preferably designed such that it has holding elements penetrating apertures in the holding strip, the apertures preferably being arranged on the holding strip in the form of a row of holes.

In order to secure the respective holding strip on the respective holding web such that the holding elements remain in engagement with the apertures in the respective holding strip, it is preferable that in a position secured on the respective holding web each holding strip is held with a holding-down device so as to rest on a securing support surface of the respective holding web. This means that the holding strip does not lift off the securing support surface of the respective holding web and, therefore, the holding elements also disengage from the apertures.

In this respect it is particularly expedient when, in the securing position, the holding-down device engages with fingers over the respective holding strip in regions between the holding elements designed as securing pins in order to also prevent any warping of the metal film of the holding strips in the regions between the securing pins during tensioning since such warping would likewise lead to the formation of folds in the stencil.

With respect to the positioning of the stencil at right angles to the plane, in which this extends, no details have so far been given. It would, for example, be conceivable to carry out this positioning via the position of the holding webs in this direction.

It has proven to be particularly advantageous, especially in order to obtain a stable position of the stencil which is suitable for a screen printing process, when the stencil is supported by a supporting web between a stencil region and an engagement of the holding web.

In this respect it would be conceivable to act on the stencil with the supporting web. It is, however, particularly advantageous when the holding web displaceable in tensioning direction places the stencil on the supporting web during tensioning.

This is, for example, possible by having the holding web pull the stencil against the supporting web during tensioning.

This may be achieved particularly advantageously when the stencil receiving means are arranged on a side located opposite the stencil of a plane defined by the supporting webs and are movable. This also has the additional advantage that the stencil receiving means also do not interfere with the movement of a doctor blade operating on the stencil.

No details have been given in conjunction with the preceding explanations of the individual embodiments concerning the arrangement of the supporting webs on the stencil holder.

In one particularly advantageous embodiment, for example, the stencil holder has an outer frame formed by frame supports, in which a stencil section is arranged, and the stencil section is limited by four supporting webs which are connected with the frame via struts. In this solution, the possibility is created by means of the outer frame of guiding and positioning the stencil holder exactly at its outer circumference in a machine operating with the stencil and, in addition, the stencil is likewise positioned exactly relative to the outer frame by means of the supporting webs which form the stencil section and are rigidly connected with the outer frame.

The positioning of the stencil by means of the supporting webs may be realized particularly simply when each of the supporting webs has a support surface, on which the holding strips of the stencil can be placed. This means in this embodiment that the stencil rests with the holding strips on the support surfaces of the supporting webs so that the stencil region, in particular, is located within the stencil section defined by the supporting webs which is of great advantage, in particular, for a fold-free and preferably even tensioning of the stencil.

In order to be able to connect the holding strips with the holding webs in a simple manner it is preferable for each holding strip to extend beyond the respective supporting web as far as the respective holding web so that the holding webs can thus engage on the holding strips outside the stencil section limited by the supporting webs.

No details have been given in conjunction with the preceding description of the inventive solution concerning the movability of the holding webs in the respective tensioning directions. In one advantageous embodiment, for example, at least one of two holding webs operative in one tensioning direction is movable in the direction of the respective tensioning direction by means of the stencil tensioning device. The other holding web can, for example, be held immovably on the frame in the tensioning direction.

No details have so far been given concerning the arrangement of the holding webs movable in the respective tensioning direction. It would, for example, be expedient for the holding webs to be guided by any type of displacement guide.

It has proven to be particularly advantageous when the holding webs are mounted on a parallel guide operative in the respective tensioning direction. This parallel guide could, for example, be designed as a lever guide. It is, however, particularly advantageous when the parallel guide comprises two longitudinal guides parallel to one another.

The longitudinal guides are expediently designed as guide bars, on which guide sleeves slide.

Alternatively to guide bars with guide sleeves as longitudinal guides which guide the holding webs, for example, within their longitudinal extension, one solution for this provides for the holding webs to be guided on longitudinal guides at their ends.

Longitudinal guides, which offer, in particular, the possibility of guiding the respective holding web exactly in the direction of its longitudinal extension and, therefore, transversely to the respective tensioning direction, are preferably provided between the two ends of each holding web and the struts connected with the frame.

Each longitudinal guide of this type is expediently formed by roller bodies extending in a guide groove, the guide groove preferably being arranged in the respective strut extending at the end of the web and the roller bodies being held, for example, on the holding web.

All the displacement guides can be designed such that they allow a movement in the respective tensioning direction with clearance transversely thereto. If, however, the movement of the respective holding web is intended to be limited exclusively to the tensioning direction, the respective displacement guide is preferably subject to the smallest possible clearance.

No details have likewise been given in conjunction with the preceding description concerning the design of the stencil tensioning device.

In one advantageous variation of the invention, for example, the stencil tensioning devices are formed by hydraulic or pneumatic tensioning elements operative in the respective tensioning direction and these elements are respectively coupled with each other such that the same forces act on the holding webs at the same time.

In the simplest case, the tensioning device comprises in this solution at least one cocking cylinder which acts between the respective holding web and the frame and with which the respective holding web is movable for tensioning the stencils.

In order to achieve an equal action of all the cocking cylinders and in an inventive manner tension in each tensioning direction at the same time with the same tensioning force, it is preferable for the cocking cylinders to be joined in parallel and connected to one pressure line so that the same pressure is built up in each cocking cylinder and, therefore, each cocking cylinder generates the same tensioning force when the cocking cylinders are identical.

In principle, one cocking cylinder per holding web would be sufficient. In order to obtain a force effect on each holding web which is as uniform as possible, two cocking cylinders which are arranged at a distance from one another and act in parallel are, however, advantageously provided between each respective holding web and the frame.

As an alternative to the aforementioned possibilities, an advantageous embodiment of an inventive tensioning device provides for a tension pulley to act on the two respective holding webs, which are located opposite one another and movable in the same tensioning direction, at the same time and to be tensioned by a tensioning element. The tension pulley is expediently a non-elastic pulley.

The tension pulley preferably has a loop operative between the frame and each respective holding web, the size of this loop being variable depending on the traction effect on the tension pulley. The tension pulley is, in particular, deflected over rollers to form each loop in order to avoid any jamming and, therefore, the occurrence of uneven forces on the holding webs.

A particularly advantageous embodiment, in which tensioning of the stencil in two tensioning directions is possible, provides for the tension pulley to serve to tension all four holding webs.

In this case, the tension pulley is deflected over deflecting rollers in corner regions of the stencil holder.

Such a tension pulley has, in principle, the advantage that it can be tensioned by means of traction via a mechanical tensioning element, for example a lever element or a tensioning sleeve, with a tensioning bolt and this traction force remains constant for a long time so that, particularly in the case where the stencil is intended to be tensioned for a long time with the same tensioning forces, such a tension pulley is of advantage in comparison with hydraulic or pneumatic solutions due to its simplicity.

In addition, such a tension pulley has the additional advantage that it can be guided by the deflecting rollers in a simple manner in any desired direction.

No particular details have so far been given concerning the application of the force of the tensioning device to the holding webs. It would, for example, be possible to act on the holding web at two spaced locations using a tension pulley.

It is, however, particularly advantageous, in particular in order to ensure an easy movability of the holding web and clamping thereof, when the stencil tensioning device acts on the holding webs in the center and the holding webs are preferably guided on both sides of the central application of force.

With respect to the way in which the stencil is tensioned in the two tensioning directions extending transversely to one another, the most varied of solutions are conceivable. In one advantageous solution, for example, the stencil receiving means have two oppositely located holding webs which are guided on the frame for displacement exclusively in the direction of the first tensioning direction, the stencil tensioning device has a source of tensioning force acting on both holding webs at the same time with the same tensioning force, the stencil receiving means have two oppositely located holding webs which are guided on the frame for displacement exclusively in the direction of the second tensioning direction and the stencil tensioning device has a source of tensioning force acting on the two holding webs at the same time with the same tensioning force.

With this solution, the advantage is to be seen in the fact that during tensioning a defined position of the stencils secured in the stencil receiving means in a direction transversely to the respective tensioning direction is provided due to the exact guidance of the two holding webs exclusively in the first tensioning direction and in the second tensioning direction and that, on the other hand, an even tensioning of the stencil in the first tensioning direction also takes place due to the simultaneous application of the same tensioning force to each of the holding webs so that the two holding webs move away from one another under the influence of the same respective tensioning force.

In this respect, the stencil is secured in its position relative to the frame due to the two tensioning directions extending transversely to one another and the exclusive guidance of the holding webs in these tensioning directions. As a result of the second tensioning direction, the stencil is secured at the same time in the first tensioning direction and as a result of the first tensioning direction the stencil is secured in the second tensioning direction so that with such a design of the inventive solution the stencil secured on the stencil receiving means can be automatically positioned exactly in the two tensioning directions.

A particularly advantageous embodiment of this solution provides for a single source of tensioning force to act on all the holding webs.

Alternatively to this solution, it is provided in a different embodiment of the inventive solution that of two holding webs operative in the first tensioning direction one of the holding webs is rigidly connected to the frame and the holding web located opposite the stationary holding web is movable in the first tensioning direction in relation to the frame and that the holding webs operative in the second tensioning direction are movable in the first tensioning direction in relation to the frame and at least one of the holding webs operative in the second tensioning direction is movable in the second tensioning direction in relation to the frame. This solution proceeds on the basis that the stencil can be adequately positioned by the holding web rigidly connected to the frame, whereby in this case it is necessary for the holding webs operative in the second tensioning direction to be movable in the first tensioning direction in order to avoid any puckering, this movability being realized by means of a guide clearance.

In this embodiment it is particularly advantageous when the holding web operative in the first tensioning direction and movable in this direction is also movable in the second tensioning direction in relation to the frame in order, in this case as well, to provide adjustment for any puckering, this movability in the second tensioning direction also being realized by means of a guide clearance.

It is provided in an additional embodiment of an inventive solution that of two holding webs operative in the first tensioning direction at least one of the holding webs is mounted for movement in the first tensioning direction in relation to the frame, that both holding webs operative in the first tensioning direction are mounted for displacement in the second tensioning direction and that the holding webs operative in the second tensioning direction are movable in the first tensioning direction in relation to the frame and at least one of the holding webs operative in the second tensioning direction is movable in the second tensioning direction in relation to the frame.

In both the embodiments described in the above it is conceivable to arrange one of the holding webs operative in the second tensioning direction so as to be non-displaceable in the second tensioning direction and only make the other holding web movable. It is particularly favorable when both holding webs operative in the second tensioning direction are mounted for movement in this direction in relation to the frame so that a symmetrical tensioning in the second direction can be realized by means of these webs.

In conjunction with the solution that of the holding webs operative in the first tensioning direction at least one of the holding webs is movable in the first tensioning direction in relation to the frame, it is provided in an advantageous solution for one of the holding webs to be mounted on the frame so as to be non-displaceable in the first tensioning direction in order to predetermine a secured position for the stencil in the first tensioning direction.

However, it is also possible for both holding webs operative in the first tensioning direction to be mounted for movement in this direction in relation to the frame, whereby in this case determination of the position of the stencil can preferably be provided via a marking on the stencil.

The invention also relates to a stencil consisting of a metal film, preferably for screen printing.

If the stencil is intended to be tensioned in two tensioning directions extending essentially at right angles to one another, it has proven to be advantageous in accordance with the invention when the stencil has holding strips extending on from a stencil region, wherein these holding strips extend at the most over the respective length of the stencil region so that the tensioning forces can have an optimum effect on the stencil region and are not reduced by holding strips, which extend beyond the stencil region and are connected with one another in this region extending beyond the stencil region, and therefore have an uneven effect on the stencil and, in the extreme case, lead to warping.

The stencil is expediently designed such that this has a rectangular stencil region and a total of four holding strips located opposite one another in pairs.

In principle it would be conceivable to manufacture the stencil region and the holding strips from different materials and, for example, connect the holding strips to the stencil region in any suitable manner.

It is, however, far more advantageous when the stencil region and the holding strips are made from a one-piece film.

The film can, in principle, likewise be made from the most varied of materials.

In view of the wear and tear on the film it has, however, proven to be advantageous when the film is a metal film.

With respect to securing the holding strips on the holding webs no details have so far been given with regard to the stencil. It is proven to be particularly advantageous, for example, when each holding strip has a row of holes for securing the same on the respective holding web so that the securing pins arranged on the holding webs can be brought into engagement with the individual holes of the row of holes.

Additional features and advantages of the invention are the subject matter of the following description as well as the drawings of one embodiment.

BRIEF DESCRIPTION OF THE DRAWINGS

FIG. 4 is an enlarged sectional illustration along line 4—4 in FIG. 2 with a stencil receiving means securely holding the stencil;

FIG. 5 is an illustration similar to FIG. 4 with a stencil receiving means opened;

FIG. 12 is a plan view similar to FIG. 8 of a third embodiment of an inventive stencil holder and FIG. 13 is a plan view similar to FIG. 8 of a fourth embodiment of an inventive stencil holder.

DETAILED DESCRIPTION OF THE INVENTION

Figure 1:
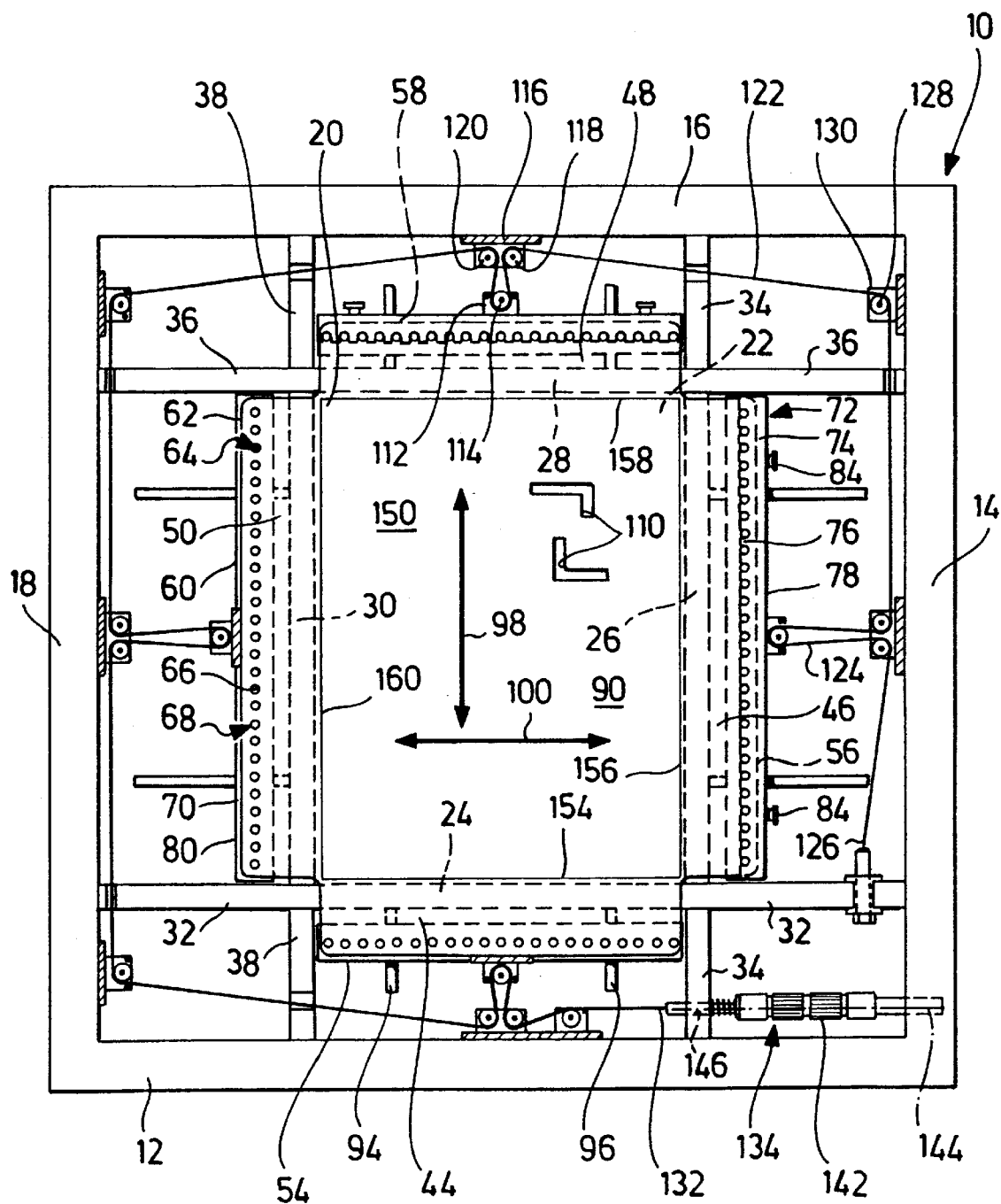
FIG. 1 is a plan view of a first embodiment of an inventive stencil holder.

A first embodiment of an inventive stencil holder, illustrated in FIG. 1, comprises a frame designated as a whole as 10 which is formed by four frame supports 12, 14, 16 and 18 forming longitudinal sides of the frame. The frame 10 can be accommodated in the region of the frame supports 12 to 18, for example, in a screen printing apparatus and exactly positioned in order to position a stencil designated as a whole as 20 exactly for screen printing.

The stencil 20 is located in a stencil section 22 of the frame 10 which is limited by four supporting webs 24, 26, 28 and 30. The supporting webs 24 to 30 are, for their part, connected with the frame supports 12 to 18 via struts 32, 34, 36, 38 extending in continuation of the webs as far as these frame supports (FIGS. 1 and 2).

Figure 2:
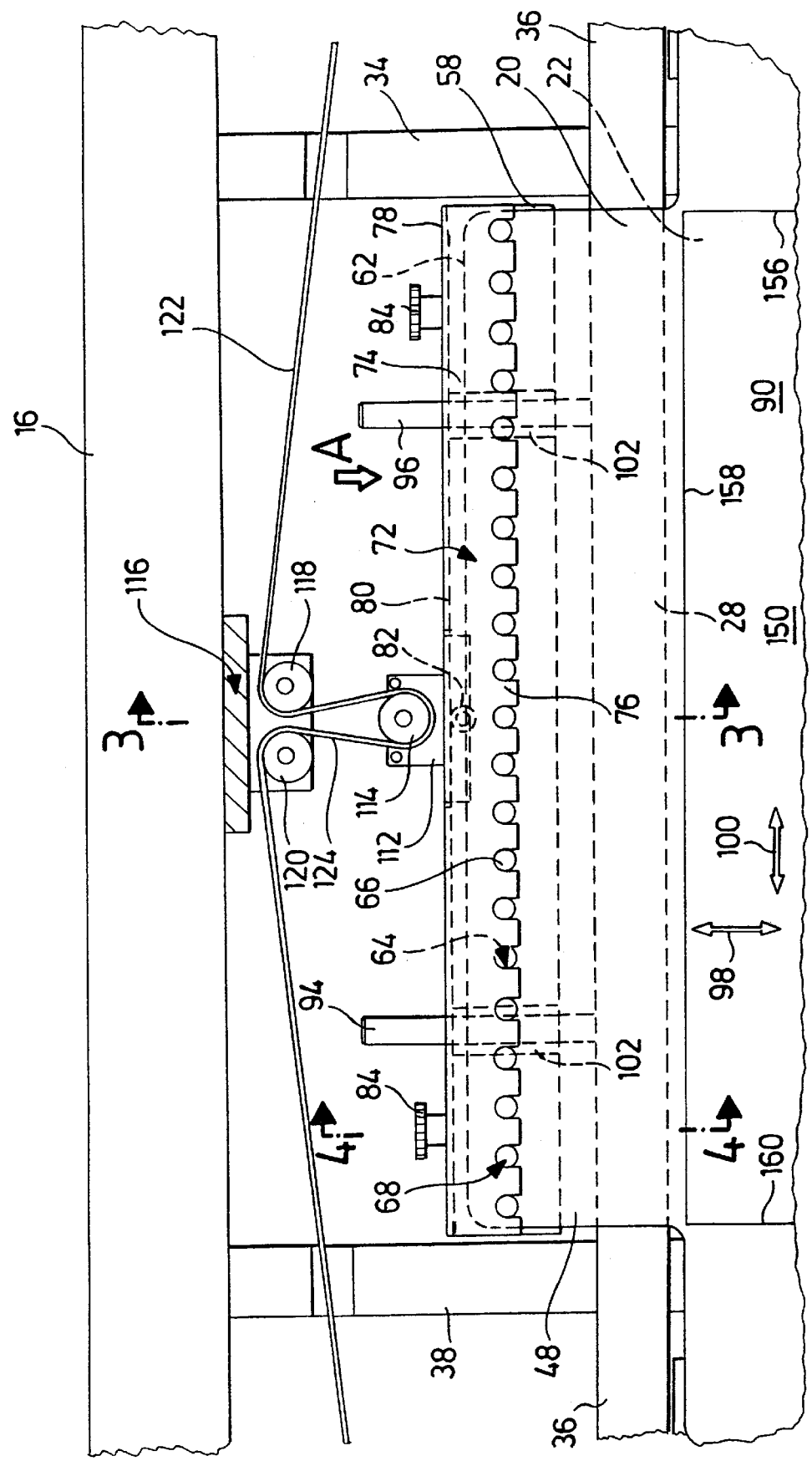
FIG. 2 is an enlarged partial view of a longitudinal side of the stencil holder.
Figure 3:
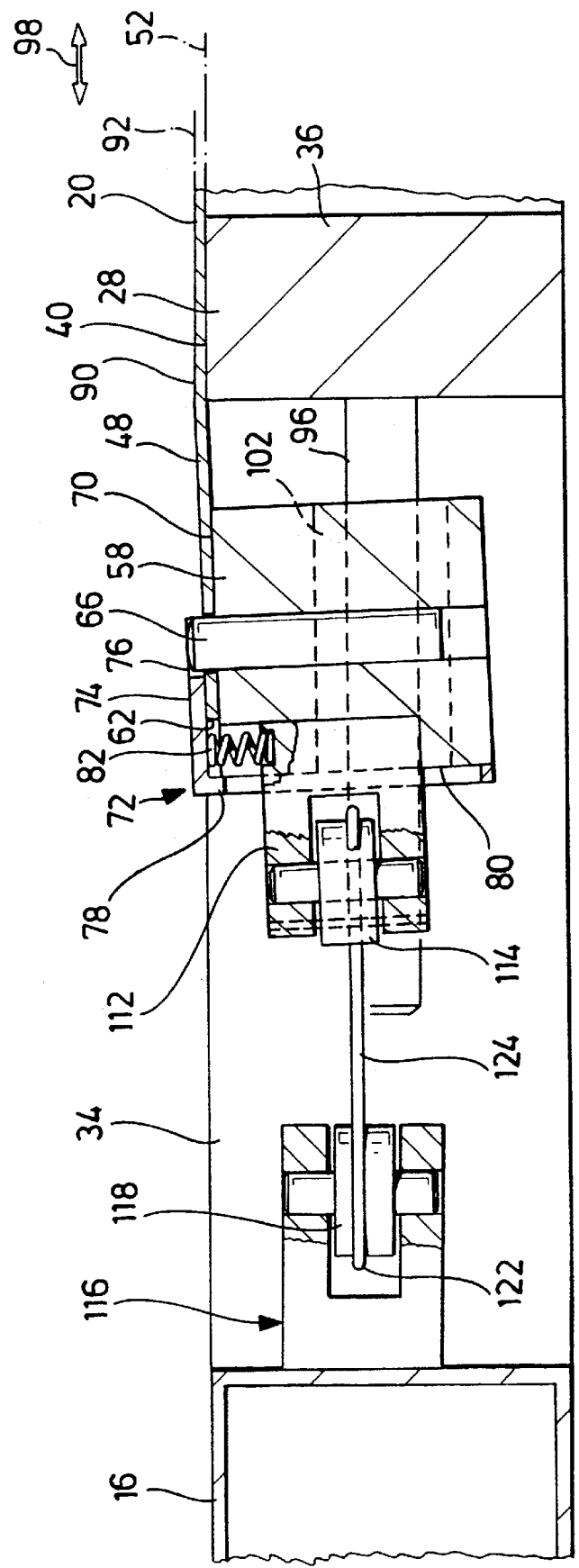
FIG. 3 is a section along line 3—3 in FIG. 2.

As illustrated in FIGS. 2 and 3 by way of example in the case of the supporting web 30, each of the supporting webs 24 to 30 comprises a support surface 40, on which lateral holding strips 44, 46, 48 and 50 of the stencil 20 can rest in order to position the stencil 20 on a defined plane 52, the plane 52 thereby being determined by the support surfaces 40 of the supporting webs 24, 26, 28 and 30.

Each of the holding strips 44 to 50 (FIG. 6) extends, in addition, beyond the respective supporting web 24 to 30 as far as a respective holding web 54, 56, 58, 60, on which the holding strip 44 can be secured.

For this purpose, the respective holding strip 44 to 50 has a row of holes 64 (FIG. 6), which extend along an outer side edge 62 and through which securing pins 66 of a row 68 of securing pins arranged on the respective holding web 54 to 60 engage (FIGS. 3, 4, 5). Laterally of the rows of holes 64 the respective holding strip 44 to 50 thereby rests on a securing support surface 70 of the respective holding web 54 to 60 and is held by means of a holding-down device 72 so as to rest on the securing support surface 70, the securing pins 66 thereby projecting out of the securing support surface 70 and engaging through the respective row of holes 64 of the holding strip 44 to 50 resting on this securing support surface 70.

The holding-down device 72 preferably has a support bar 74 which extends parallel to the securing support surface 70 and, as illustrated in FIG. 2, engages over the respective holding strip 44 to 60 in its regions between the securing pins 66 with fingers 76. Furthermore, the holding-down device 72 comprises a guide arm 78 which rests on a side 80 of the respective holding web 54 to 60 facing away from the respective supporting web 24 to 30 and is movable relative to the respective holding web 54 to 60 transversely, preferably at right angles to the securing support surface 70 in order to move the support bar 74 towards or away from the securing support surface 70 (FIGS. 4, 5). The holding-down device 72 is preferably acted upon (FIG. 5) by a pressure spring 82 acting on the support bar 74 in the direction of a position of the support bar 74 detaching the respective holding strip 44 to 50 and is movable contrary to the force of the pressure spring 82 into a position (FIG. 4) abutting the respective holding strip 44 to 50 on the securing support surface 70 and can be secured in this position by clamping screws 84, the clamping screws 84 thereby engaging through elongated holes 86 in the guide arm 78 and thus serving, together with the elongated holes 86, as a guide means for the guide arms 78 on the respective holding web 54 to 60.

In accordance with the invention, both the holding webs 54 to 60 with the respective holding-down devices 72 and the securing pins 66 are arranged such that they are located beneath a plane 92 defined by an upper side 90 of the stencil 20 in the region of the stencil section 22 in the position securing the holding strips 44 to 50 so that a doctor blade running over the upper side 90 can move away over both the holding-down device 72 and the securing pins 66 without colliding with them.

Each of the holding webs 54 to 60 is guided for movement in only one tensioning direction 98 or 100 by a parallel guide, formed by two guide bars 94 and 96 parallel to the respective tensioning direction 98, 100, the tensioning directions 98 and 100 thereby extending parallel to the plane 92 and, moreover, at right angles to one another. The holding webs 54 and 58 are thereby movable exclusively in the tensioning direction 98 and the holding webs 56 and 60 exclusively in the tensioning direction 100.

The guide bars 94 and 96 are, for example, held on the supporting webs 24 to 30 but they can also be held additionally or alternatively on the frame supports 12 to 18.

In order to make it possible for the holding webs 54 to 60 to slide easily on the guide bars 94 and 96, the holding webs are guided via guide sleeves 102, preferably designed as spherical sleeves, so as to slide exactly and easily on the guide bars 94 and 96 designed as round bars. Due to the exactly defined displaceability of the oppositely located holding webs 54 and 58 in the tensioning direction 98 and the oppositely located holding webs 56 and 60 in the tensioning direction 100, the stencil 20 is positioned exactly in the plane 92 with a row of holes 64 designed in the form of a fit and securing pins 68 so that slots 110 provided therein are positioned in a defined manner in the plane 92 when the stencil 20 is placed with the rows of holes 64 over the respective rows 68 of securing pins.

Figure 7:
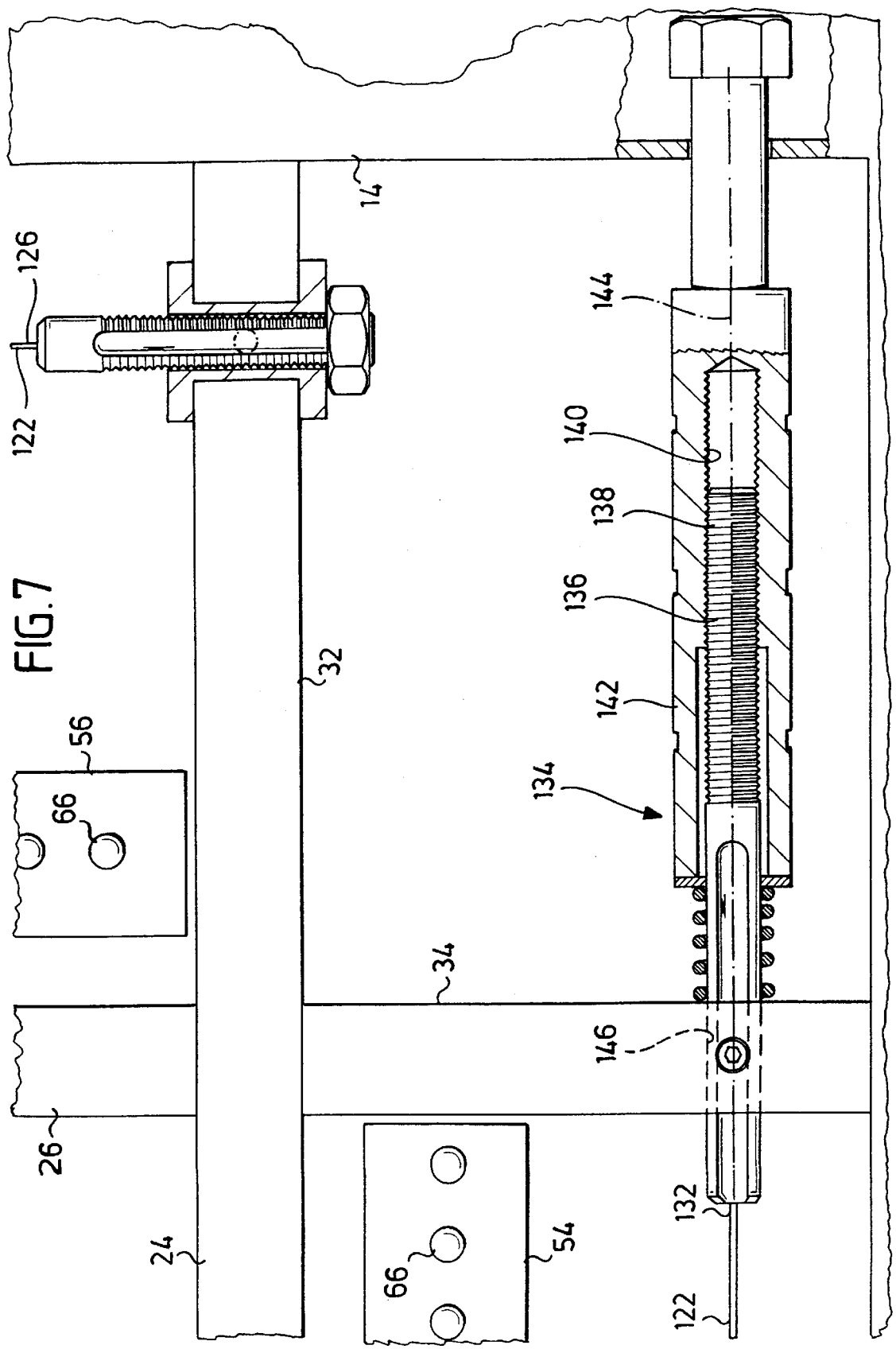
FIG. 7 is an enlarged section through a tensioning element of the stencil holder.

For the purpose of tensioning the stencil 20, the respectively opposite holding webs 54 and 58 as well as 56 and 60 are movable in the corresponding tensioning direction 98 and 100, respectively, by means of a common stencil tensioning device which comprises a bearing block 112 arranged on each of the holding webs 54 to 60 and a tensioning roller 114 arranged for rotation on the respective bearing block 112, as well as deflecting blocks 116 arranged on the frame supports 12, 14, 16 and 18 opposite the bearing blocks 112 and having two deflecting rollers 118 and 120, between which a tension pulley 122 formed in the simplest case by a steel wire protrudes in the form of a loop 124 and winds around the tensioning roller 114. The tension pulley 122 thereby extends, proceeding from a fixed end 126 and deflected each time by corner deflecting rollers 128 mounted in corner deflecting blocks 130, from one deflecting block 116 to the next, the loop 124 leading to the respective holding web 54 to 60 thereby being formed in the region of each deflecting block 116. At the end 132 of the tension pulley 122 opposite its end 126, this is tensioned by means of a tensioning element 134 illustrated in FIG. 7, which has a tensioning bolt 136 rigidly connected to the end 132, this bolt having an external thread 138 which engages, for its part, in an internal thread 140 of a tensioning sleeve 142 which, for its part, is mounted for rotation on the frame 10, for example on the frame support 14 (FIG. 7).

Furthermore, the tensioning bolt 136 is guided on the frame 10 so as to be non-rotatable but displaceable in the direction of its longitudinal axis 144, preferably in an opening 146 through the strut 34, so that the tensioning bolt 136 is displaceable in the direction of its longitudinal axis 144 due to rotation of the tensioning sleeve 42 in order to tension the tension pulley 122 and thus generate via each of the loops 124 the tensioning force acting in the respective tensioning direction 98 and 100 and therefore tension the stencil 20 in the tensioning directions 98 and 100 at the same time. As a result, the holding strips 44 to 50 engage on the support surfaces 40 of the supporting webs 24 to 30 and thus the stencil 20 rests exactly on the plane 52 defined by the support surfaces 40 of the supporting webs 24 to 30 so that, in addition to the exact positioning of the stencil 20 in the tensioning directions 98 and 100, an exact positioning at right angles to these tensioning directions 98 and 100 can be achieved.

Figure 6:
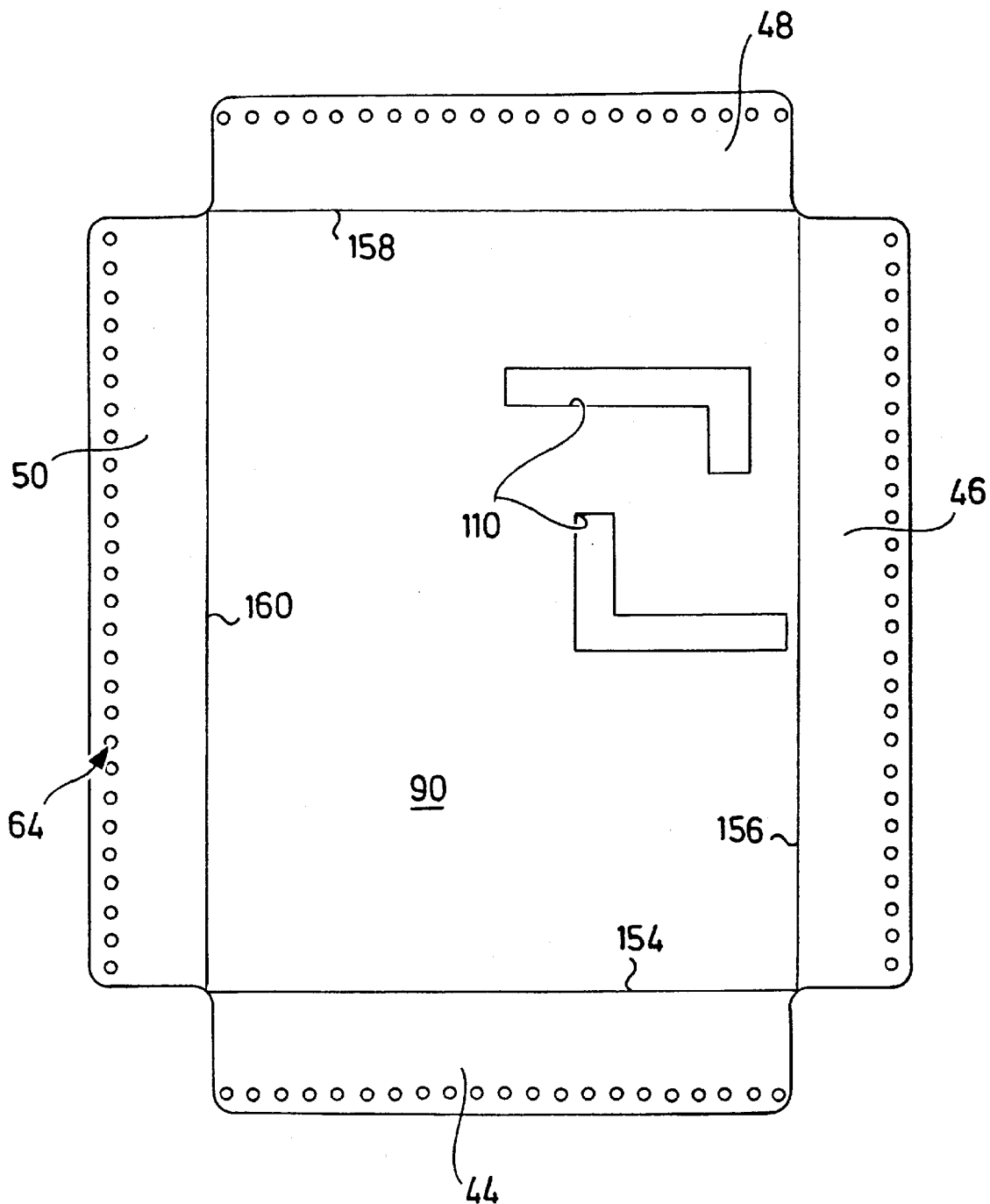
FIG. 6 is a plan view of a stencil for the stencil holder.

The stencil is preferably designed such that it has a central stencil section 150, in which the slots 110 required for the screen printing are arranged, and, adjoining side edges 154, 156, 158 and 160 of the stencil section 150 forming a border for the stencil section 150, the holding strips 44, 46, 48 and 50, each of which extends at the most over the length of the respective, corresponding side edge 154, 156, 158, 160 so that the stencil 20 has corner cutouts. This means that the tensioning effect in the one tensioning direction 98 and the tensioning effect in the respectively other tensioning direction 100 are not reduced by the holding strips 44 to 50 but can develop fully over the respective extension of the stencil section 150 in the respective tensioning direction 98, 100 (FIG. 6).

In a second embodiment of an inventive stencil holder, those parts which are identical to those of the first embodiment are given the same reference numerals and so with respect to their description reference can be made in full to the comments concerning the first embodiment.

Figure 8:
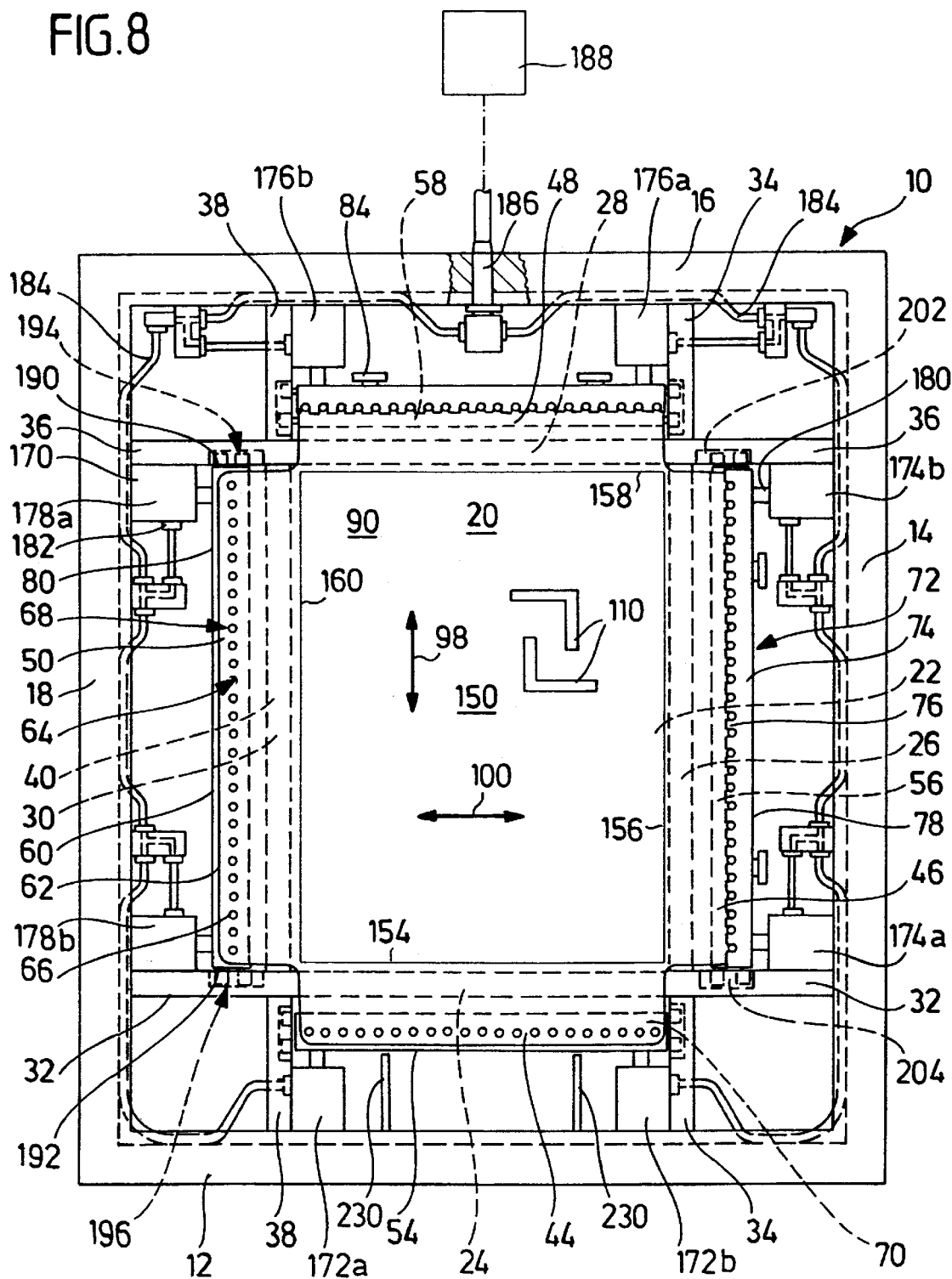
FIG. 8 is a plan view similar to FIG. 1 of a second embodiment of an inventive stencil holder.
Figure 9:
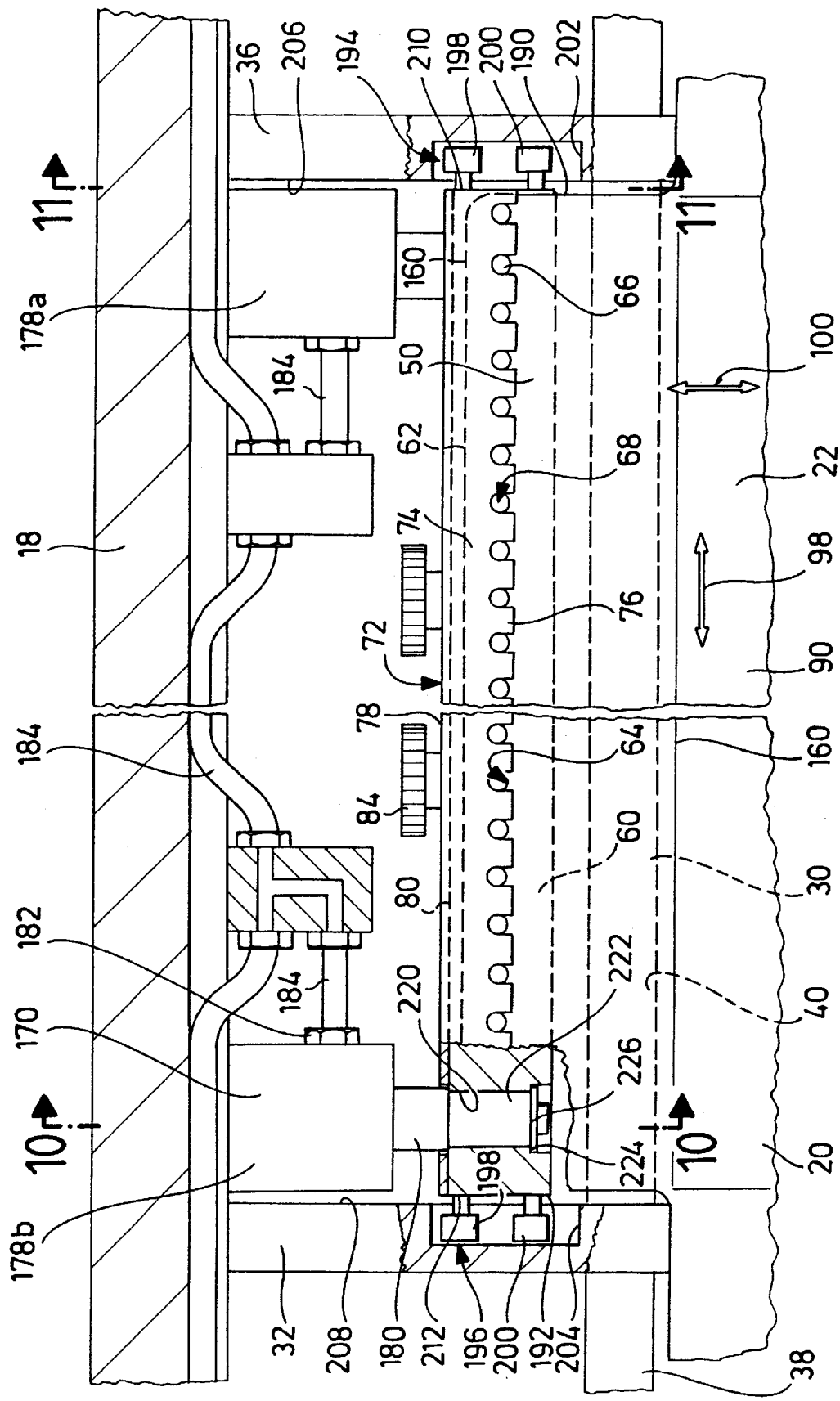
FIG. 9 is an enlarged partial view similar to FIG. 2 of the second embodiment.
Figure 10:
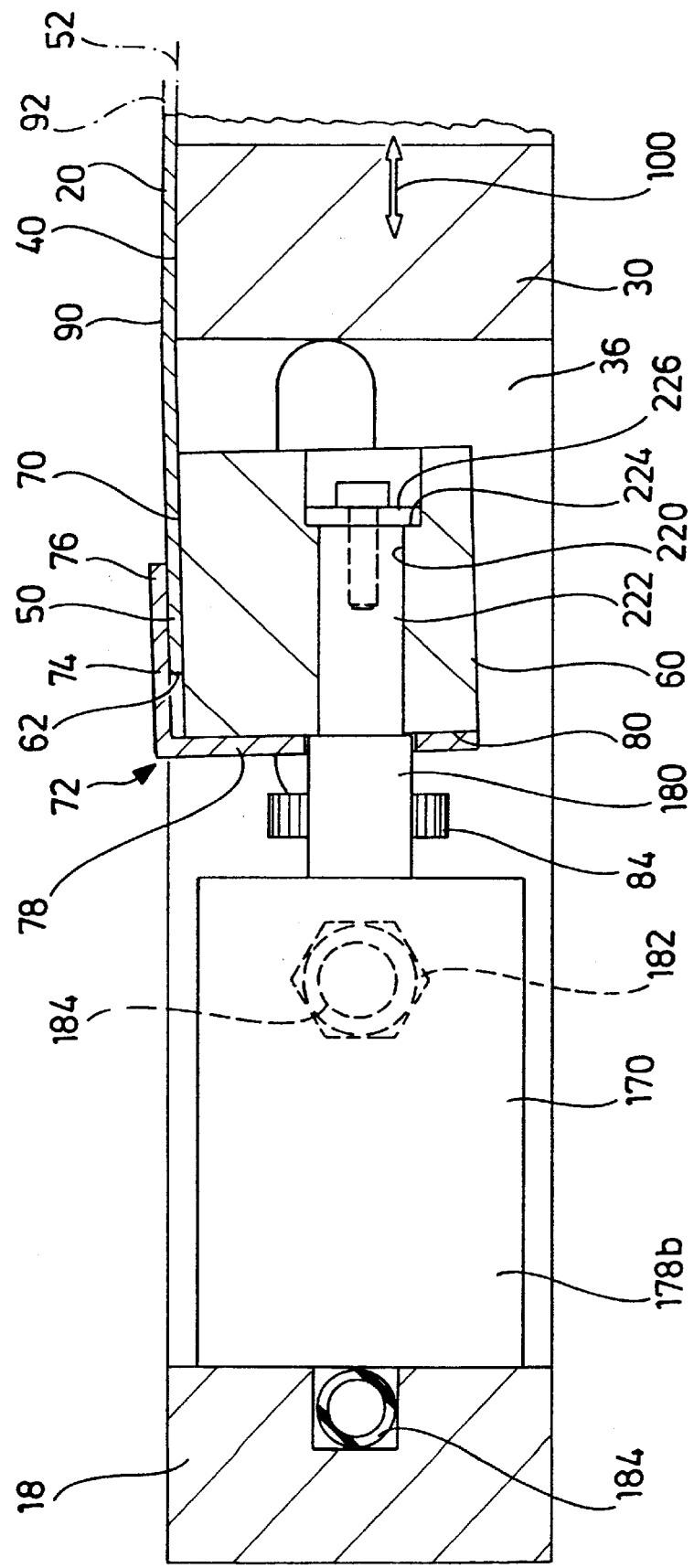
FIG. 10 is a section along line 10—10 in FIG. 9.

In the second embodiment of the inventive stencil holder, illustrated in FIGS. 8 and 9, cocking cylinders 172a,b, 174a,b, 176a,b and 178a,b arranged each time in pairs on the respective frame supports 12, 14, 16, 18 with their cylinder housing 170 are operative between the frame supports 12, 14, 16, and 18 and the holding webs 54, 56, 58, 60, a piston rod 180 of the cylinders 172, 174, 176, 178 being connected with the respective holding web 54, 56, 58, 60.

A pressure connection 182 of each of the cylinders 172, 174, 176, 178 is connected with a pressure line 184 guided on the frame 10, the pressure line 184 being connectable centrally via a pressure connection pipe 186 with a pressure source 188 which continuously supplies a constant pressure which leads to each of the cocking cylinders 172, 174, 176, 178 acting on the respective holding web 54, 56, 58, 60 with the same force since the pressure line 184 builds up the same pressure in the cocking cylinders 172, 174, 176, 178 which are joined in parallel.

Figure 11:
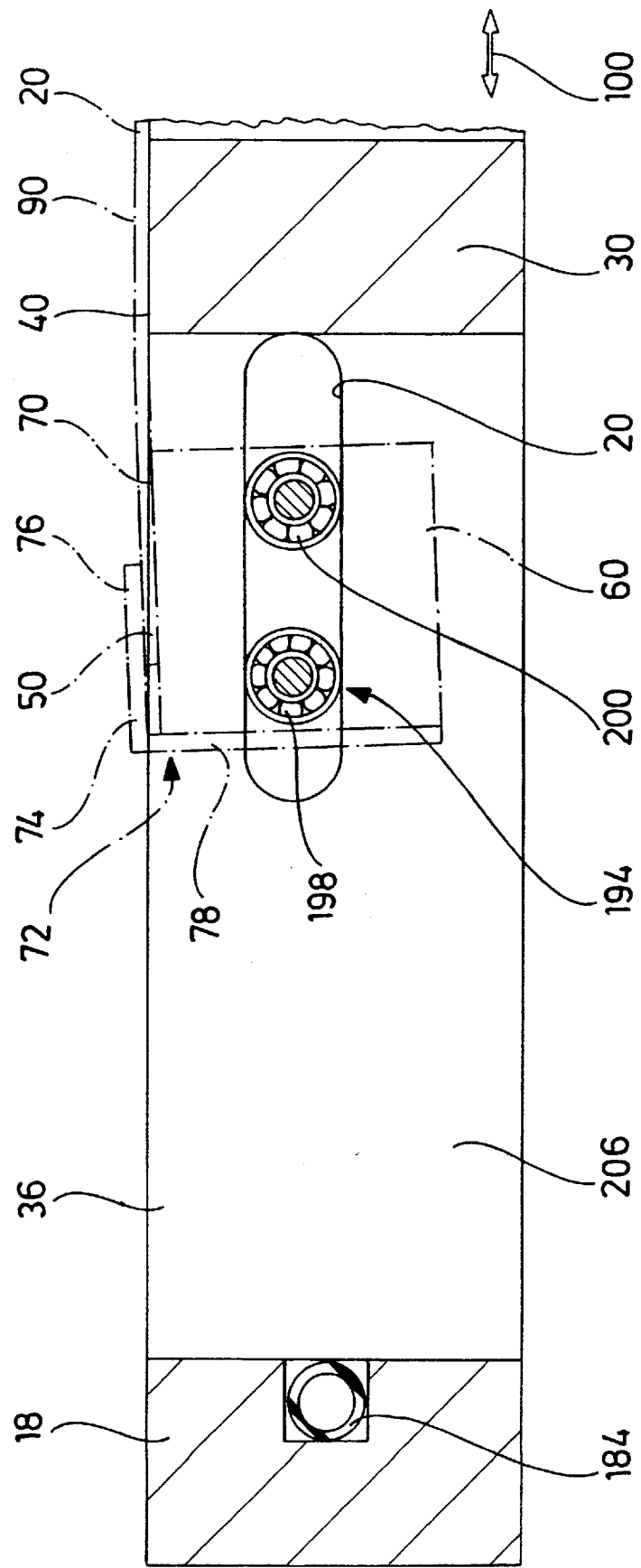
FIG. 11 is a section along line 11—11 in FIG. 9.

In contrast to the first embodiment, each of the holding webs 54, 56, 58, 60 is, as illustrated in FIG. 9 and FIG. 11, provided at its two ends 190, 192 with a pair of rollers 194, 196 consisting of two rollers 198, 200 which are arranged in spaced relation to one another and, as illustrated in FIGS. 9 and 11 with the example of the holding web 60, are guided in a groove 202, 204 of the webs 336, 32 associated with the ends 190, 192. The grooves 202, 204 are thereby dimensioned such that they guide the rollers 198, 200 exactly parallel to the respective tensioning direction, in the case of FIGS. 9 and 11 the tensioning direction 100, so that the respective holding web 60 is also guided parallel to the tensioning direction 100.

The respective holding web 60 is guided transversely to the tensioning direction 100 in the embodiment illustrated in FIG. 9 in that its ends 190, 192 slide with its end surfaces 210, 212 on the respectively facing strut 36, 32 on its surface 206, 208 facing the holding web 60. An even more precise guidance of the respective holding web 58 transversely to the tensioning direction 98 is possible in that a roller body guide is operative between the ends 190, 192 of the respective holding web 60 and the struts 36, 32 of the frame 10, the ends 190, 192 of the respective holding web 60 being supported via this roller body guide on the end struts 32, 36 arranged respectively at the ends.

The connection between the piston rod 180 of each of the cocking cylinders 172, 174, 176, 178 takes place by means of a bore 220 arranged in the respective holding web 58. This bore penetrates a section 222 of the piston rod 180 located at the end and reduced in diameter, this section being provided at its end with a disk 226 which protrudes radially and engages over an annular flange 224 in the respective holding web and which allows the traction force of the respective cocking cylinder 176 to act on the respective holding web 58 via the annular flange 224.

In order to obtain a particularly exact positioning of the holding webs 54, 56, 58, 60 in the tensioned state of the stencil 20, an end stop in the form of two end stop elements 230 is preferably associated with each one of two pairs of oppositely located holding webs 54, 58 or 56, 60. These end stop elements allow an end position of the respective holding web 54, 56 to be exactly determined when cocking cylinders 172, 174, 176, 178 develop a traction effect on all the holding webs 54, 56, 58, 60 so that the respectively opposite holding web 58, 60 keeps the stencil tensioned due to the cocking cylinders 176, 178 acting on it and proceeding from these end positions while the cocking cylinders 172, 174 keep the respective holding web 54, 56 resting against the stop pins 230. This means that the possibility is created by the stop elements 230 of positioning the stencil 20 with even greater precision than is possible by means of the longitudinal guides of the holding webs 54, 56, 58, 60.

In a variation of the second embodiment, it is, however, likewise conceivable to guide the holding webs 54, 56, 58, 60 not only parallel to the respective tensioning direction 98, 100, in which they are operative, but also to provide for each pair of holding webs 54, 58 and 56, 60, respectively, which are operative in one of the tensioning directions 98 or 100 to be movable at least to a limited extent in the respectively other tensioning direction 100 or 98. For this purpose, as illustrated in FIG. 9 with the example of the holding web 60, the respective holding web 60 is guided in that its ends 190, 192 are guided with clearance between the respectively facing struts 36, 32 so that the end surfaces 210, 212 of the holding web 60 come to rest on the surfaces 206, 208 of the struts 36, 32 respectively facing them after a limited movement in the direction of the first tensioning direction 98 whereas the respective holding web 60 is operative in its tensioning direction 100 and is also guided in this direction by the rollers 198, 200 located in the grooves 202, 204 for movement in relation to the frame 10.

With this variation of the second embodiment, an exact positioning of the stencil 20 during tensioning is no longer possible but the possibility is given, due to a marking on the stencil, of positioning the tensioning frame exactly for the screen printing procedure due to the means for moving the tensioning frame such that the slots 110 are located in the desired position.

In a third embodiment of an inventive stencil holder, illustrated in FIG. 12, one of the holding webs 54, 56, 58, 60, for example the holding web 54, is secured on the frame 10 so as to be non-displaceable not only in its operative tensioning direction 98 but also transversely to this, i.e. parallel to the tensioning direction 100.

The remaining holding webs 56, 58, 60 are mounted for movement not only in their operative tensioning direction, i.e. in the case of the holding web 58 in the first tensioning direction 98 and in the case of the holding webs 56 and 60 in the direction of the second tensioning direction 100, but also, preferably, transversely to their operative tensioning direction, i.e. in the case of the holding web 58 in tensioning direction 100 and in the case of the holding webs 56 and 60 in tensioning direction 98, the holding webs 56, 58, 60 thereby being preferably guided in this direction with clearance, as described in conjunction with the variation of the second embodiment.

Furthermore, the holding webs 56, 58, 60 can also be acted upon by the cocking cylinders 174, 176 and 178 in the manner described in order to tension the stencil 20.

In the third embodiment according to FIG. 12, it is possible, even though the holding web 54 is held rigidly on the webs 38 and 34, to tension the stencil 20 evenly in both tensioning directions 98, 100 when the cocking cylinders 174, 176 and 178 are in operation due to the fact that the holding webs 56, 60 have the possibility of moving with clearance transversely to their operative tensioning direction 100, i.e. in tensioning direction 98, between the webs 36 and 32 and thus compensate for any slight deformation of the stencil 20 which is tensioned proceeding from the stationary holding web 54. In addition, the holding web 58 advantageously has the possibility of moving with clearance transversely to its operative tensioning direction 98, i.e. in tensioning direction 100, between the webs 38 and 34 in order to, where necessary, compensate for any transverse movements, i.e. movements in the direction of the tensioning direction 100, occurring due to the tensioning of the holding webs 56, 60 with the cocking cylinders 174 and 178.

With respect to the description of the remaining features of the third embodiment, reference is made in full to the explanations concerning the first and second embodiments.

In a fourth embodiment, illustrated in FIG. 13, both the holding web 54 and the holding web 56 are no longer acted upon by a cocking cylinder but these are secured in position in their operative tensioning direction 98 and 100, respectively, between end stops 230 and 232 or 234 and 236.

The holding webs 54 and 56 are mounted with clearance between the respective struts 38 and 34 or 32 and 36 transversely to their respectively operative tensioning direction, i.e. in the case of the holding web 54 in tensioning direction 100 and in the case of the holding web 58 in tensioning direction 98. The holding webs 54 and 56 are preferably secured in position in the same way as described in conjunction with the second embodiment, i.e. via grooves 202 and 204 in the corresponding webs 38 and 34 or 32 and 36 as well as pairs of rollers 194, 196 arranged at the ends of the holding webs 54 and 56.

The other two holding webs 58 and 60 are mounted in the manner already described and can be acted upon by cocking cylinders 176 and 178, respectively, in their operative tensioning direction 98 and 100, respectively.

In addition, the holding webs 58 and 60 are also arranged for movement with clearance between the respective webs 34 and 38 or 36 and 32 transversely to their operative tensioning direction, i.e. in the case of the holding web 58 in tensioning direction 100 and in the case of the holding web 60 in tensioning direction 98.

When the cocking cylinders 176 and 178 are acted upon with pressure, the corresponding holding webs 58 and 60, respectively, act in the respective tensioning direction 98 or 100 and, at the same time, all the holding webs 54, 56, 58, 60 have the possibility of being displaced, due to their displaceability transversely to the operative tensioning direction, between the corresponding webs to such an extent that the stencil 20 can be tensioned evenly in both tensioning directions 98, 100.

With respect to the description of the remaining features of the fourth embodiment, reference is made in full to the explanations concerning the first and second embodiments.

What is claimed is:

1. A stencil holder comprising:
    a stencil made of a one-piece metal film;
    a frame;
    two first stencil receiving means arranged on said frame for detachably holding the stencil on opposite sides thereof and for tensioning said stencil in a first direction;
    two second stencil receiving means arranged on said frame for detachably holding said stencil on opposite sides thereof and for tensioning said stencil in a second direction, said second direction extending transversely to said first direction;
    holding strips which are part of said one-piece metal film and extend from first portions which adjoin respective edges of a stencil region of said stencil, each of said first portions of the holding strips having a length which is no greater than a length of the respective adjoining edge of the stencil region, said holding strips being adapted to be detachably secured on a respective one of said stencil receiving means by a positive connection;
    a stencil tensioning device arranged on said frame and acting on at least one of said first stencil receiving means and on both of said second stencil receiving means for tensioning said stencil in said first and said second tensioning directions; and
    a supporting web fixedly arranged with respect to said frame between said stencil region and a second portion of said respective holding strip that is fixed by said stencil receiving means;
    said stencil receiving means being arranged such that said stencil is pulled against said supporting web by said stencil receiving means during operation of said stencil tensioning device,
    said holding strip with its second portion running from said supporting web to said receiving means extending away from a plane defined by an upper side of said stencil region.

2. A stencil holder as defined in claim 1, wherein each holding strip is adapted to be detachably secured on a corresponding single one of said stencil receiving means.

3. A stencil holder as defined in claim 1, wherein:
    each stencil receiving means comprises a row of holding elements penetrating a corresponding row of apertures in the respective holding strip to be received in the associated stencil receiving means.

4. A stencil holder as defined in claim 3, further comprising a holding-down device for each of said holding strips; and
    a securing support surface for each of said receiving means;
    wherein in a position secured to the row of holding elements, each holding strip is held by the associated holding-down device so as to rest on the securing support surface of the respective receiving means.

5. A stencil holder as defined in claim 4, wherein in the securing position the holding-down device engages with fingers over the respective holding strip in regions between the holding elements.

6. A stencil holder as defined in claim 3, further comprising:
    displacement guides associated with said stencil receiving means;
    wherein said stencil receiving means comprise corresponding movable holding elements that are guided by the associated displacement guide.

7. A stencil holder as defined in claim 6, further comprising:
    parallel guides associated with said movable holding elements and operative in the respective tensioning directions;
    wherein the movable holding elements are mounted on the associated parallel guide for movement in the respective tensioning directions.

8. A stencil holder as defined in claim 1, wherein each stencil receiving means has a positioning means operative transversely to the tensioning direction.

9. A stencil holder as defined in claim 8, wherein the positioning means comprises a fit.

10. A stencil holder as defined in claim 9, wherein the fit is formed by a row of holes and corresponding fitting fingers engaging therein.

11. A stencil holder as defined in claim 1, wherein two oppositely located stencil receiving means mounted on the frame form the stencil receiving means in each tensioning direction.

12. A stencil holder as defined in claim 1, wherein the stencil receiving means are arranged on a side located opposite the stencil of a plane defined by the supporting web.

13. A stencil holder as defined in claim 1, wherein each of the supporting webs has a support surface, the holding strips of the stencil being adapted to rest on said surface.

14. A stencil holder as defined in claim 1 comprising two holding webs operative in one tensioning direction, at least one of said holding webs being movable in the tensioning direction by means of the stencil tensioning device.

15. A stencil holder as defined in claim 1, wherein the stencil tensioning device has tensioning elements operative in the respective tensioning direction, said tensioning elements being respectively coupled with one another such that the same tensioning forces act on the stencil receiving means at the same time.

16. A stencil holder as defined in claim 1, wherein the stencil tensioning device comprises at least one cocking cylinder acting between a respective stencil receiving means and the frame.

17. A stencil holder as defined in claim 16, wherein a plurality of cocking cylinders are joined in parallel and connected to one pressure line.

18. A stencil holder as defined in claim 17, wherein two cocking cylinders acting in parallel are provided between the respective stencil receiving means and the frame.

19. A stencil holder as defined in claim 18, wherein the cocking cylinders are constantly acted upon with a medium under pressure when the stencil is tensioned.

20. A stencil holder as defined in claim 1, wherein said tensioning device comprises a tension pulley and a tensioning element.

21. A stencil holder as defined in claim 20, wherein the tension pulley forms a loop operative between the frame and each respective stencil receiving means.

22. A stencil holder as defined in claim 1, wherein a single source of tensioning force acts on all the movable stencil receiving means.

23. A stencil as defined in claim 1, said stencil having a rectangular stencil region and a total of four holding strips located opposite one another in pairs.

24. A stencil holder comprising:

a stencil made of metal film and having holding strips which are part of said metal film extending from first portions which adjoin respective edges of a stencil region of said stencil, each of said first portions having a length in a longitudinal direction which is no greater than a length of a respective adjoining edge of the stencil region, each holding strip being adapted to be detachably secured on a respective holding web extending in said longitudinal direction, for tensioning said stencil in first and second tensioning directions, a frame, a first pair of oppositely located holding webs, each holding web of said first pair extending parallel to the longitudinal direction of a respective one of two oppositely located holding strips, said holding webs being guided on said frame for displacement in said first tensioning direction extending transverse to said longitudinal direction, at least one of said holding webs of said first pair being guided on said frame for displacement exclusively in said first tensioning direction, and being adapted to receive said respective holding strips in one defined position with respect to said frame in said second tensioning direction, a second pair of oppositely located holding webs, each holding web of said second pair extending parallel to the longitudinal direction of a respective one of said holding strips, said holding webs of said second pair being guided on said frame for displacement in said second tensioning direction extending transverse to said longitudinal direction of the respective holding strip, at least one of said holding webs of said second pair being guided on said frame for displacement exclusively in said second tensioning direction, and being adapted to receive said respective holding strip in one defined position with respect to said frame in said first tensioning direction, and a stencil tensioning device arranged on said frame and acting on said holding webs for tensioning said stencil in said first and second tensioning directions extending transversely to one another.

25. A stencil holder comprising:

a stencil made of metal film and having holding strips which are part of said metal film extending from first portions which adjoin respective edges of a stencil region of said stencil, each of said first portions having a length in a longitudinal direction which is no greater than a length of a respective adjoining edge of the stencil region, each holding strip being adapted to be detachably secured on a respective holding web extending parallel to said longitudinal direction of the holding strip, for tensioning said stencil in first and second tensioning directions, a frame, a first pair of oppositely located holding webs, each holding web of said first pair extending parallel to the longitudinal direction of a respective one of two oppositely located holding strips, one of said holding webs being fixedly arranged with respect to said frame, and the other of said holding webs being guided on said frame for displacement in said first tensioning direction extending transverse to said longitudinal direction, said fixedly arranged holding web being adapted to receive said respective holding strip in one defined position relative to said frame with respect to said first and second tensioning directions, a second pair of oppositely located holding webs, each holding web of said second pair extending parallel to the longitudinal direction of a respective one of said holding strips, said holding webs of said second pair being guided on said frame for displacement in said second tensioning direction extending transverse to said longitudinal direction of the respective holding strip, and a stencil tensioning device arranged on said frame acting on said holding webs for tensioning said stencil in said first and second tensioning directions extending transversely to one another.

26. A stencil holder as defined in claim 25, wherein said stencil region is rectangular and a total of four holding strips are located opposite one another in pairs.

27. A stencil holder as defined in claim 25, wherein the holding web operative in the first tensioning direction and movable on this direction is also movable in the second tensioning direction in relation to the frame.

28. A stencil holder as defined in claim 25, wherein both holding web operative in the second tensioning direction are mounted for movement in the first tensioning direction in relation to the frame.

29. A stencil holder comprising:

a stencil made of metal film and having holding strips which are part of said metal film extending from first portions which adjoin respective edges of a stencil region of said stencil, each of said first portions having a length in a longitudinal direction which is no greater than a length of a respective adjoining edge of the stencil region, each holding strip comprising a row of apertures, said row extending parallel to said longitudinal direction of the holding strip, for tensioning said stencil in first and second tensioning directions, a frame, a first pair of oppositely located rows of holding elements for penetrating the rows of apertures in respective oppositely located holding strips, each row of holding elements of said first pair extending parallel to the longitudinal direction of its respective holding strip, said holding elements of said first pair being guided on said frame for displacement in said first tensioning direction extending transverse to said longitudinal direction of the respective holding strip, at least one row of holding elements of said first pair being guided on said frame for displacement exclusively in said first tensioning direction, and cooperating with said respective row of apertures to position said respective holding strip in one defined position with respect to said frame in said second tensioning direction, a second pair of oppositely located rows of holding elements for penetrating the rows of apertures in respective oppositely located holding strips, each row of holding elements of said second pair extending parallel to the longitudinal direction of its respective holding strip, said holding elements of said second pair being guided on said frame for displacement in said second tensioning direction extending transverse to said longitudinal direction of the respective holding strip, at least one row of holding elements of said second pair being guided on said frame for displacement exclusively in said second tensioning direction, and cooperating with said respective row of apertures to position said respective holding strip in one defined position with respect to said frame in said first tensioning direction, and a stencil tensioning device arranged on said frame and acting on said holding elements for tensioning said stencil in said first and second tensioning directions extending transversely to one another.

30. A stencil holder comprising:

a stencil made of metal film and having holding strips which are part of said metal film extending from first portions which adjoin respective edges of a stencil region of said stencil, each of said first portions having a length in a longitudinal direction which is no greater than a length of a respective adjoining edge of the stencil region, each holding strip comprising a row of apertures, said row extending parallel to said longitudinal direction of the holding strip, for tensioning said stencil in first and second tensioning directions, a frame, a first pair of oppositely located rows of holding elements for penetrating the rows of apertures in respective oppositely located holding strips, each row of holding elements of said first pair extending parallel to the longitudinal direction of its respective holding strip, one of said rows of holding elements of said first pair being fixedly arranged with respect to said frame and the holding elements of the other row being guided on said frame for displacement in the direction of said first tensioning direction extending transverse to said longitudinal direction, said fixedly arranged row of holding elements cooperating with its respective row of apertures to provide one defined positioning of said respective holding strip of said stencil relative to said frame with respect to said first and second tensioning directions, a second pair of oppositely located rows of holding elements for penetrating the rows of apertures in respective oppositely located holding strips, each row of holding elements of said second pair extending parallel to the longitudinal direction of its respective holding strip, said holding elements of said second pair being guided on said frame for displacement in said second tensioning direction extending transverse to said longitudinal direction of the respective holding strip, and a stencil tensioning device arranged on said frame and acting on said holding elements for tensioning said stencil in said first and second tensioning directions extending transversely to one another.

* * * * *